United States Patent [19]

Webb et al.

[11] Patent Number: 5,477,084

[45] Date of Patent: Dec. 19, 1995

[54] MICROELECTRONIC DEVICE PACKAGING CONTAINING A LIQUID AND METHOD

[75] Inventors: Brian A. Webb, Chandler; Robert M. Wentworth, Phoenix, both of Ariz.

[73] Assignee: Motorola, Inc., Schaumburg, Ill.

[21] Appl. No.: 367,628

[22] Filed: Jan. 3, 1995

Related U.S. Application Data

[62] Division of Ser. No. 119,555, Sep. 13, 1993, Pat. No. 5,413,965.

[51] Int. Cl.⁶ .................................................. H01L 25/04
[52] U.S. Cl. ........................................ 257/714; 257/712
[58] Field of Search ...................................... 257/706, 707, 257/712, 713, 714, 715, 716, 717, 719, 787, 796

[56] References Cited

U.S. PATENT DOCUMENTS

| | | | |
|---|---|---|---|
| 4,092,697 | 5/1978 | Spaight | 257/714 |
| 4,323,914 | 4/1982 | Berndlmaier et al. | 257/714 |
| 4,612,978 | 9/1986 | Cutchaw | 257/714 |
| 5,243,223 | 9/1993 | Yamada et al. | 257/714 |
| 5,270,572 | 12/1993 | Nakajima et al. | 257/714 |
| 5,305,184 | 4/1994 | Andresen et al. | 257/714 |
| 5,323,294 | 6/1994 | Layton et al. | 257/714 |

*Primary Examiner*—Sara W. Crane
*Assistant Examiner*—S. V. Clark
*Attorney, Agent, or Firm*—Kevin B. Jackson; Frederick M. Fliegel

[57] ABSTRACT

A method for manufacturing a liquid-containing microelectronic device package. The method includes steps of providing (32) a base (16) including a microelectronic device (22) and a seal area disposed peripherally about the base (16), providing (34) a lid (12) and providing (34) a sealant (14) disposed between the base (16) and lid (12). The method also includes steps of immersing (36) the base (16), sealant (14) and lid (12) in a liquid (24) having a temperature above a sealant activation temperature and maintaining (38) the base (16), sealant (14) and lid (12) in the liquid (24) for a time sufficient to allow the liquid (24) to enter between the base (16) and lid (12) and to heat and thereby activate the sealant (14). The method further includes removing (40) the base (16), lid (12) and sealant (14) from the liquid (24) to provide a sealed, liquid-containing microelectronic device package (10).

16 Claims, 2 Drawing Sheets

MICROELECTRONIC DEVICE PACKAGING CONTAINING A LIQUID AND METHOD

This is a division of application Ser. No. 08/119,555, filed Sep. 13, 1993, now U.S. Pat. No. 5,413,965.

FIELD OF THE INVENTION

This invention relates, in general, to the field of packaging for microelectronic components, and more particularly to a simple liquid-containing package having improved manufacturability.

BACKGROUND OF THE INVENTION

Recent trends in manufacturing of electronic equipment place increased emphasis on reliability and robustness of components employed in such equipment. Effective heat dissipation for power devices pose particular problems for several reasons. Typically, photolithographically defined structures on a top surface of a semiconductor device generate heat while thermally conductive attachment to a heatsink is effected via a bottom surface thereof. Heat thus is coupled from the active device area, through the die and then to the heatsink. As integration levels increase, larger amounts of heat are generated at the top surface and coupled through semiconductor materials having relatively poor thermal conductivity and heat capacity, which can determine the maximum packing density of large scale integrated circuits and/or large-signal or power semiconductor devices. Devices atop the die surface which are not necessarily generating heat themselves are heated by nearby structures, affecting the electronic properties thereof.

One approach to heat removal which has been attempted is to place the semiconductor device in a specially designed liquid-containing device package and lid. A dielectric liquid having benign chemical properties and suitable thermal properties (e.g., vaporization and solidification temperatures) is employed. Prior art packages employ heat exchanging structures and/or bellows to accommodate the liquid-containing cavity and to allow for thermal expansion, etc. These arrangements are not cost-effective for many microelectronic packaging applications. Furthermore, techniques developed to date for evacuating the cavity and back-filling same with dielectric liquids are complex, labor-intensive and poorly suited to volume production. Moreover, approaches employing large cavities and relatively small volumes of liquid therein are not able to maintain the liquid in contact with the chip area absent gravity, in the presence of some accelerations and/or unless the package is in a particular position, which tends to limit the applications for which such packages are well suited.

What are needed are methods and apparatus for providing liquid-filled or liquid-containing semiconductor device packages which also provide improved manufacturability and which are suited to a broad range of applications.

SUMMARY OF THE INVENTION

Briefly stated, there is provided a new and improved microelectronic device package containing a liquid and a method for manufacturing same. The method includes steps of providing a package base including a microelectronic device and also a seal area which is disposed peripherally about the package base, providing a lid disposed over the package base and providing a sealant disposed between the package base and the lid. The method also includes steps of immersing the package base, the sealant and the lid in a liquid having a temperature above an activation temperature of the sealant and maintaining the package base, the sealant and the lid in the liquid for a time sufficient to allow the liquid to enter the package between the package base and the lid and to heat the sealant to activate the sealant. The method further includes removing the package base, the lid and the sealant from the liquid to provide a sealed microelectronic device package containing the liquid.

DETAILED DESCRIPTION OF THE DRAWING

Figure 1:
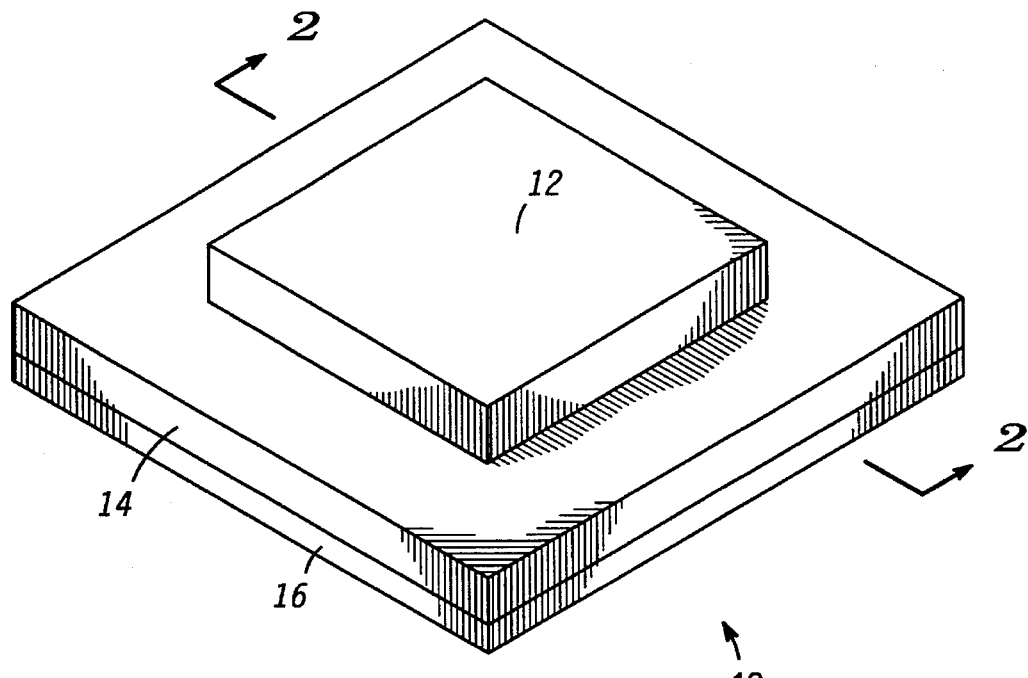
FIG. 1 shows an isometric view of a liquid-containing microelectronic device package in accordance with the present invention.

FIG. 1 is a sketch showing an isometric view of liquid-containing microelectronic device package 10 in accordance with the present invention. Package 10 having lid 12 sealed to base 16 by sealant 14 encloses a microelectronic component (not illustrated in FIG. 1). Package 10 may be any of a number of distinct package types known in the art, such as pin grid array or PGA packages, dual in line or DIP packages formed from separate lids and bases, ball grid array, multi-chip module substrata, ceramic packages and the like.

Figure 2:
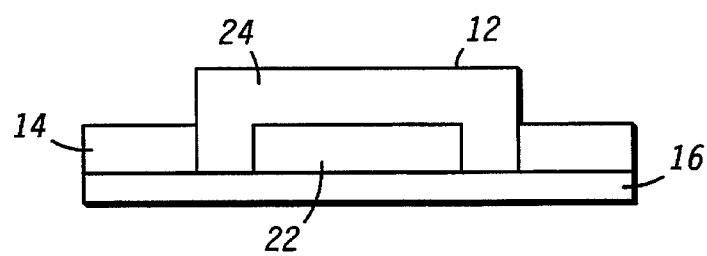
FIG. 2 illustrates a sectional side view, taken along section lines 2—2 of FIG. 1.

FIG. 2 illustrates a sectional side view, taken along section lines 2—2 of FIG. 1. Base 16 having microelectronic device 22 die-bonded thereto also desirably includes external electrical interconnections (not shown) electrically coupled to device 22 via wirebonding, solder bumping, etc., as are known in the art. Bases (e.g., base 16) made from a single layer of alumina or multilayer bases made of insulating materials and having provision for electrical interconnections are available from a variety of vendors such as Kyocera International, San Diego, Calif.

Base 16 is coupled to lid 12 via sealant 14 peripherally disposed about lid 12 and/or base 16, providing liquid-filled cavity 24.

Figure 3:
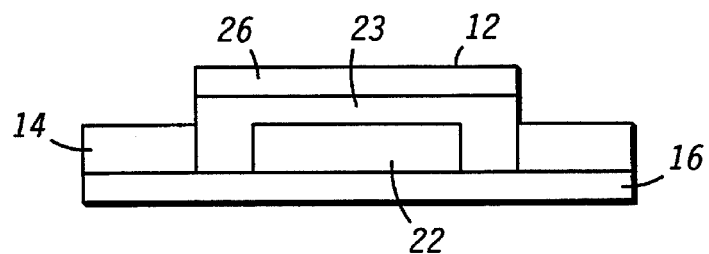
FIG. 3 illustrates a sectional side view of a second embodiment of the present invention.

FIG. 3 illustrates a sectional side view showing a second embodiment of package 10 (FIG. 1). The embodiment of FIG. 3 is similar to the embodiment of FIG. 2, except that portion 26 of the package interior is not liquid filled, i.e., is a bubble above liquid 23 and within lid 12. This arrangement allows portion 26 to absorb stresses occurring when liquid portion 23 expands in response to heat, for example.

Lids (e.g., lid 12, FIGS. 1–3) made from a variety of suitable materials (ceramic, metal including stamped metal lids, plastic and the like) and in shapes and sizes to purchaser specifications, with or without sealant (e.g., B-staged epoxy having a predetermined activation temperature, or solder having a predetermined composition and melting temperature) disposed thereon as desired, are available from a variety of vendors including Kyocera International, San Diego, Calif.

Dielectric liquids suitable for inclusion in packages of the present invention have at least the following five properties: they (i) are chemically benign (nonreactive in the device environment), (ii) have liquid-solid phase change (or "pour") temperature below the expected operating temperature range of the semiconductor device package, (iii) are electrically nonconductive within the expected operating temperature range, (iv) have good thermal conductivity and (v) have gas-liquid phase change temperature within or above the expected operating temperature range.

In some instances, it is desirable to obtain the heat-exchanging benefits provided by allowing some of the liquid within the package to boil, while in other cases, heat conduction and convection of the liquid alone are adequate to provide the desired cooling for the semiconductor device 22. In the former case, it is desirable to provide a region such as 26 (FIG. 3) of controlled size in order to maintain a layer of liquid or the die surface while providing a volume within which vaporized material may condense and to allow for thermal expansion of liquid 23. In the former case, it is also necessary to employ a sealant which undergoes an irreversible change (e.g., chemical reaction) at the activation temperature, rather than a solder, for example The size or volume of portion 26 needs to be large enough to relieve thermal stresses and small enough that semiconductor device 22 is fluid-covered in normal operation.

Dielectric liquids suitable for use according to the present invention have at least two additional properties they (vi) do not prevent the sealant from wetting the base and lid and (vii) the vaporization or boiling temperature exceeds an activation (e.g., chemical or phase change) temperature of the sealant. Suitable liquids have boiling points which are usefully greater than 125° C., desirably greater than 100° C and preferable greater than 50° C. Examples of suitable liquids having pour temperatures and boiling points in useful ranges include the Fluorinert® family of low molecular weight perfluorinated liquids (e.g., $CF_3$—$[(O$—$C_2F_4$—$CF_2)_n$—$(O$—$CF_2)_m]$—$O$—$CF_3$) available from 3M (St. Paul, Minn.) and the Galden® group of products available from Montefluos (Milan, Italy).

For example, FC-40 (3M) comprises a mixture of perfluorinated carbon compounds having between five and eighteen carbon atoms per molecule and having a boiling point of about 155° C., a viscosity of circa 2.2 centiStokes at room temperature and a specific gravity of about 1.9, which does not interfere with wetting of metal or ceramics by epoxies such as B-staged epoxy and which has a boiling point above at least some activation temperatures for some such epoxies.

Figure 4:
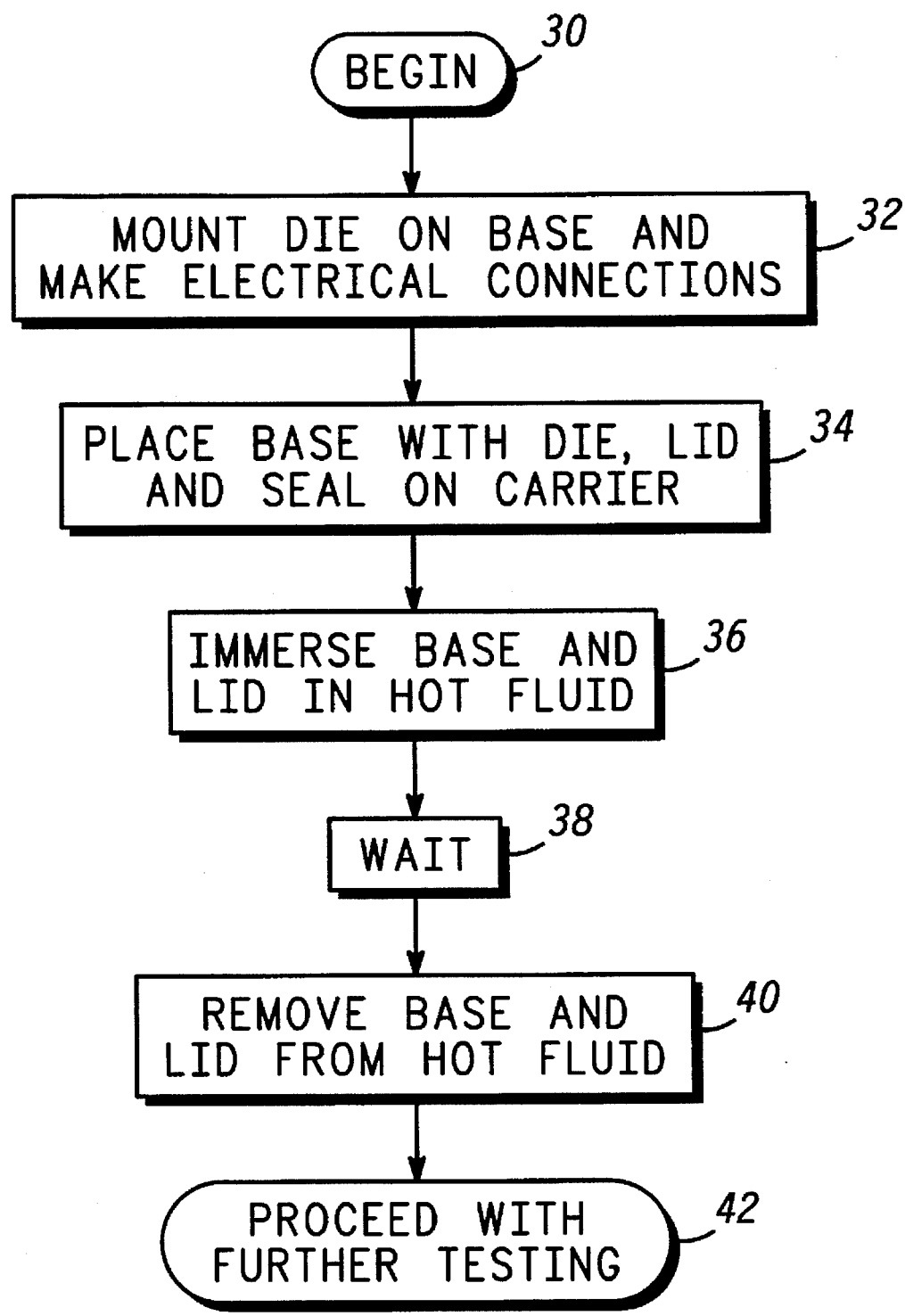
FIG. 4 is a flow chart of a method for making a liquid-containing microelectronic device package in accordance with the present invention.

FIG. 4 is a flow chart of a method for sealing a microelectronic device package containing a liquid in accordance with the present invention. The method for providing liquid-containing packages begins (block 30) and includes die mounting and making electrical interconnections to the die (block 32) in ways compatible with subsequent processing steps. The method includes placing a lid and a base having a microelectronic device physically and electrically coupled thereto together on a carrier (block 34), where the lid and/or base may include sealant disposed around an edge thereof. Alternatively, the sealant may be a preform placed between the lid and base. The carrier including the lid, base and sealant are then placed in a heated bath of the liquid which the package is to contain (block 36). The bath is (pre)heated to a temperature (e.g., a first temperature) at which the sealant undergoes either a phase change (e.g., melting of solder material or thermoplastic material) or a chemical change (e.g., setting of a thermosetting material such as B-staged epoxy), precipitating bonding and sealing of the lid to the base (block 38). The sealant forms a continuous seal about the volume to be sealed. During the sealing process, gas trapped within the package is heated, a majority of the gas is expelled from the area to be sealed (block 38) and the liquid displaces the majority of the gas within the package. The package is removed from the bath, forming a seal between the package base and the lid (block 40). The device in the liquid-containing package is then ready (block 42) for further testing (e.g., to verify seal integrity, electrical performance and the like).

In some cases, it is desirable to largely or completely fill the package interior. By placing lid 12 in an inverted position, placing base 16 atop inverted lid 12 together with sealant 14 and submerging the lid/base combination in the liquid, no opportunity is provided for a bubble of gas to be trapped within package 12. In other cases, it is desirable to provide a bubble such as 26 of FIG. 3. This can be effected by placing base 16 in a non-inverted position, placing lid 12 atop base 16 and submerging the combination. The "bowl" of lid 12 traps a controlled amount of gas within the package to provide a sealed package having primarily liquid therein and including a bubble of gas. It will be appreciated that, alternatively, a bowl or dimple may be included in the base and that the lid may present a flat surface.

Thus, an encapsulated microelectronic device and method for manufacturing same are provided, overcoming specific problems and accomplishing certain advantages relative to prior art methods and mechanisms. The process facilitates simultaneous removal of air from packages, addition of heat-exchanging liquids to the package interior and sealing of the package in a simple, cost-effective fashion. By this arrangement, the heat-generating portion of a microelectronic device is placed in direct contact with a liquid which can remove heat therefrom by conduction, convection and/ or phase change (evaporation), providing heatsinking capability directly at the portion of the circuit which provides the heat. The package manufacturing process is extremely simple and straightforward and does not require special tooling, complicated processing operations or involve use of chemical compounds known to be hazardous to the operator(s) or to the environment and provides robust packaging for microelectronic devices.

The improvements over known technology are significant and include simplicity of manufacturing, low manufacturing costs, improved fabrication yields and improved product robustness in installation and use.

What is claimed is:

1. A microelectronic device package containing a liquid, including in combination:

a base;

a microelectronic device mounted on the base;

a lid to cover the microelectronic device;

a sealant disposed between the base and the lid, the sealant securing the lid to the base to form a hollow, sealed cavity therebetween, the sealant having an activation temperature; and a liquid disposed in the sealed cavity, the liquid comprising a mixture of perfluorocarbons having a boiling point which exceeds the activation temperature.

2. A device package as claimed in claim 1, wherein the sealant comprises a thermally-activated epoxy compound having an activation temperature comprising a setting temperature which is below the boiling point of the liquid.

3. A device as claimed in claim 1, wherein the base comprises alumina.

4. A device as claimed in claim 1, wherein the liquid comprises a mixture of perfluorocarbons having a boiling point of more than one hundred twenty five degrees Celsius.

5. A device as claimed in claim 1, wherein the lid comprises a stamped metal lid having a dimple extending upward from the base, the dimple for providing a pocket of gas having a predetermined volume above the liquid.

6. A device as claimed in claim 1, wherein the lid comprises a stamped metal lid.

7. A device as claimed in claim 1, wherein the lid includes the sealant disposed about a periphery of the lid, the sealant comprising a thermally-activated epoxy compound having a setting temperature below the boiling point of the liquid.

8. A device as claimed in claim 1 wherein the sealant comprises a low temperature solder having a melting point, wherein the activation temperature equals the melting point.

9. A device as claimed in claim 1 wherein the sealant comprises a thermoplastic material having a melting point, wherein the activation temperature equals the melting point.

10. A device as claimed in claim 1 wherein the liquid only partially fills the sealed cavity.

11. A liquid-filled semiconductor device package comprising:

a base having a semiconductor device mounted on one surface;

a lid covering the semiconductor device;

a sealing layer securing the lid to the base to form a sealed cavity surrounding the semiconductor device, the sealing layer having an activation temperature; and a dielectric liquid at least covering the semiconductor device, the dielectric liquid having a boiling point in excess of the activation temperature.

12. A device package as claimed in claim 11 wherein the sealing layer comprises a thermosetting material.

13. A device package as claimed in claim 11 wherein the dielectric liquid comprises a mixture of perfluorinated carbon compounds.

14. A device package as claimed in claim 13 wherein the dielectric liquid comprises a mixture of perfluorinated carbon compounds having between five and eighteen carbon atoms per molecule.

15. A device package as claimed in claim 11 wherein the lid comprises a ceramic.

16. A device package as claimed in claim 11 wherein the lid comprises a stamped metal lid having a dimple extending away from the base, the dimple providing a pocket of gas having a predetermined volume above the dielectric liquid.

* * * * *